(12) United States Patent
Beach et al.

(10) Patent No.: US 7,821,034 B2
(45) Date of Patent: Oct. 26, 2010

(54) INTEGRATED III-NITRIDE DEVICES

(75) Inventors: Robert Beach, Altadena, CA (US); Paul Bridger, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/650,835

(22) Filed: Jan. 8, 2007

(65) Prior Publication Data

US 2007/0176201 A1 Aug. 2, 2007

Related U.S. Application Data

(60) Provisional application No. 60/757,371, filed on Jan. 9, 2006.

(51) Int. Cl.
*H01L 21/337* (2006.01)

(52) U.S. Cl. .............. 257/194; 257/183; 257/200; 257/E29.12; 257/E29.54

(58) Field of Classification Search ......... 257/183–210, 257/12–39, 221, 280, 243, 255, 621, E29.12, 257/E29.127, E29.45, E29.253
See application file for complete search history.

(56) References Cited

U.S. PATENT DOCUMENTS

| 6,492,669 | B2 | 12/2002 | Nakayama et al. | |
|---|---|---|---|---|
| 6,696,726 | B1 | 2/2004 | Bencuya et al. | |
| 2006/0289894 | A1* | 12/2006 | Murata et al. | 257/192 |
| 2006/0289901 | A1* | 12/2006 | Sheppard et al. | 257/256 |

* cited by examiner

*Primary Examiner*—Cuong Q Nguyen
*Assistant Examiner*—Cathy N Lam
(74) *Attorney, Agent, or Firm*—Farjami & Farjami LLP

(57) ABSTRACT

A III-nitride heterojunction semiconductor device that includes a power electrode that is electrically connected to a conductive substrate through a trench in the heterojunction thereof.

20 Claims, 5 Drawing Sheets

US 7,821,034 B2

INTEGRATED III-NITRIDE DEVICES

RELATED APPLICATION

This application is based on and claims priority to the of U.S. Provisional Application Ser. No. 60/757,371, filed on Jan. 9, 2006, entitled Integrated FETs in Common Drain Configuration Using Metal Via For Connection to Substrate, to which a claim of priority is hereby made and the disclosure of which is incorporated by reference.

DEFINITION

III-nitride as used herein refers to a semiconductor alloy from the InAlGaN system that includes at least Nitrogen and another alloying element from group III. Examples of a III-nitride alloy are AlN, GaN, AlGaN, InGaN, InAlGaN, or any combination that includes nitrogen or at least one element from group III.

BACKGROUND AND SUMMARY OF THE INVENTION

The present invention relates to semiconductor devices and more particularly to III-nitride heterojunction semiconductor devices.

Conventional III-nitride power heterojunction semiconductor devices include at least two power electrodes and a gate arrangement disposed therebetween all disposed on one surface of a semiconductor die. Consequently, conventional III-nitride heterojunction semiconductor devices are typically lateral conduction devices.

In many applications, including power applications, two or more devices need to be integrated. Integration of lateral conduction devices results in relatively complex routing and the like which results, among other drawbacks, parasitic drain to source capacitance.

In accordance with the invention, the substrate of a III-nitride heterojunction semiconductor device is used as a third access path to a set of active contacts, rather than simply shorting the substrate to a source or drain, or just floating.

More specifically, in a device according to the present invention a third power electrode residing on a top surface of the device is connected vertically down to the substrate using a metal plug or via. The third power electrode may be disposed between the two other power electrodes.

The third electrode may be a drain electrode while the other two electrodes may be the first source electrode and the second source electrode. Thus, the electrodes may be arranged in the sequence source 1, drain, source 2, or, in the case of a half bridge arrangement, source 1, source 2, drain, source 2, source 2, source 1, source 2, drain, and so on.

In a device according to the present invention, the basic idea is to use the vertical direction through the device to facilitate the integration of multiple switches, which results in the following:

ease of metal routing;
reduction of high voltage metal cross-overs;
reduction of drain to source capacitance from those cross-overs; and
device symmetry with respect to substrate in a common drain configuration.

Other features and advantages of the present invention will become apparent from the following description of the invention which refers to the accompanying drawings.

BRIEF DESCRIPTION OF THE DRAWING(S)

DETAILED DESCRIPTION OF THE FIGURES

Figure 1:
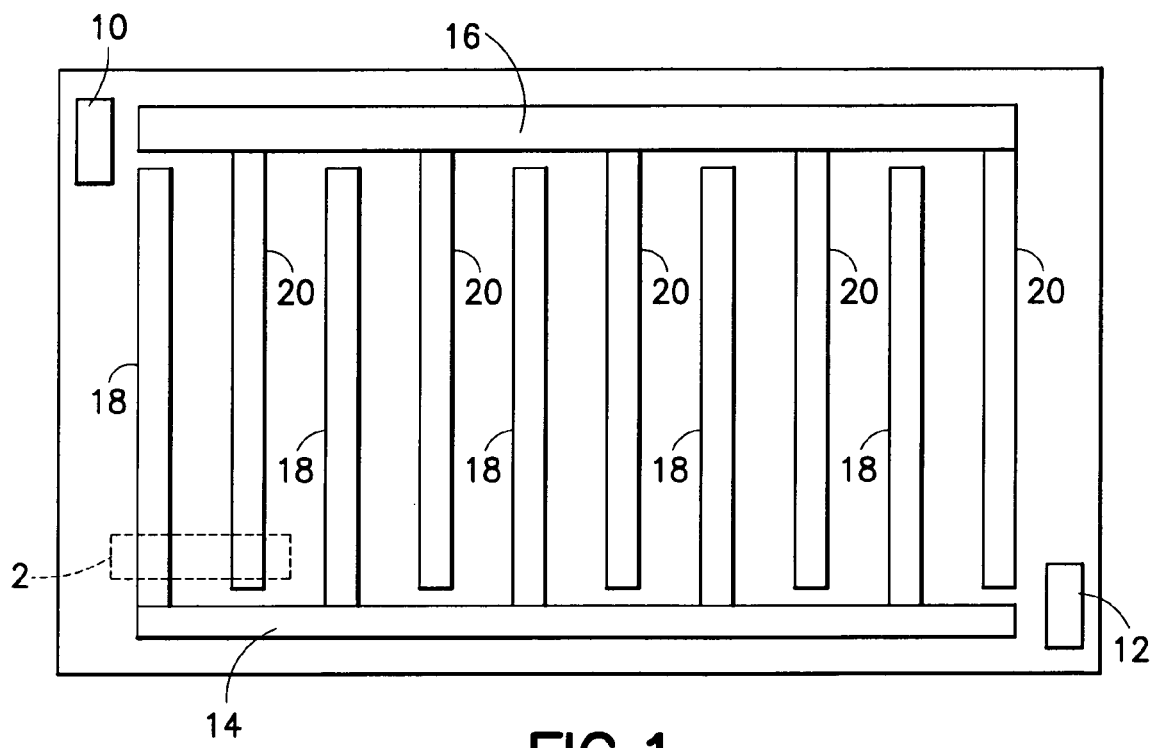
FIG. 1 shows a top plan view of a device according to the present invention.

Referring to FIG. 1, a III-nitride device according to the present invention may include a first gate contact 10, a second gate contact 12, a first power contact 14 (e.g. first source contact), and a second power contact 16 (e.g. second source contact). First power contact 14 is connected to a plurality of first power runners 18, while second power contact 16 is connected to a plurality of second power runners 20 spaced from said first power runners. Preferably, first and second power runners are parallel and alternately arranged in an interdigitated manner.

Figure 2:
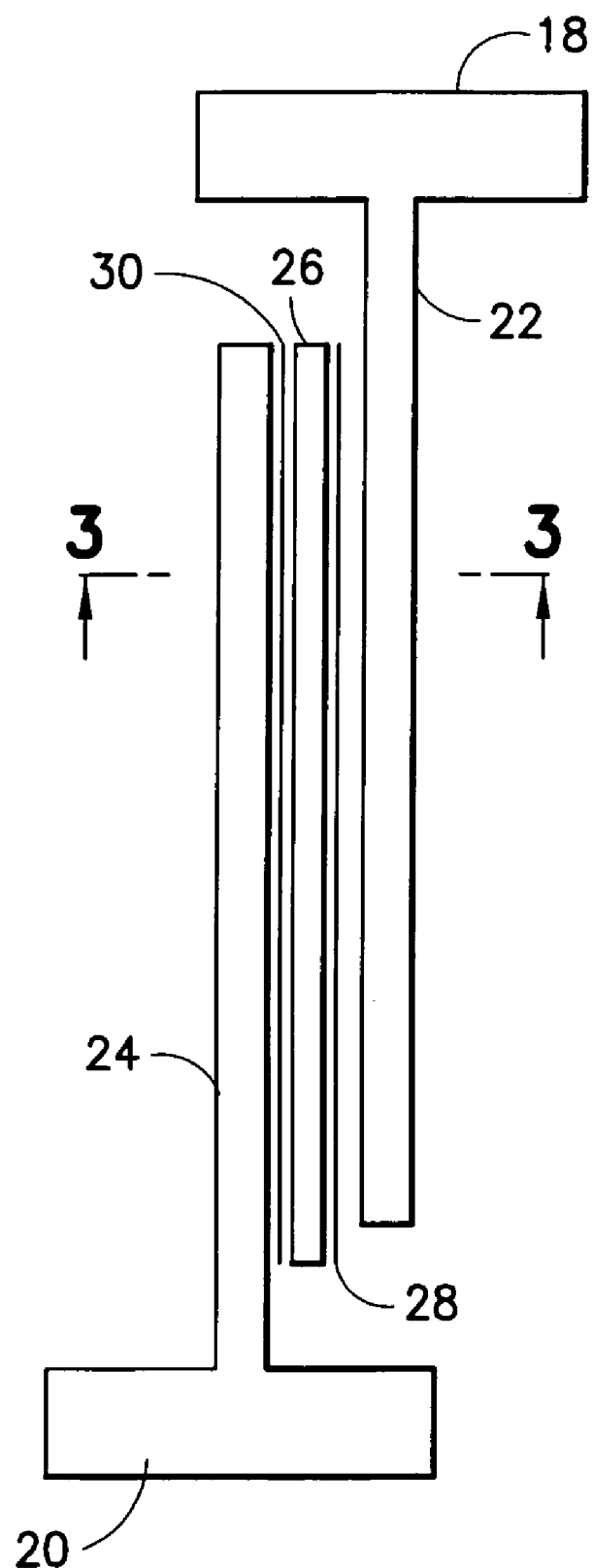
FIG. 2 illustrates selected region 2 in FIG. 1 that has been enlarged for better illustration thereof.

Referring next to FIG. 2, in each active cell of a device according to the present invention, each first power runner 18 is electrically connected to a plurality of first power electrodes 22 (e.g. first source electrodes), while second runner 20 is connected to a plurality of second power electrodes 24 (e.g. second source electrodes) spaced from said first power electrodes 22. Preferably, first and second power electrodes 22, 24 are parallel one another and are arranged in an interdigitated manner. In each active cell, a third power electrode 26 (e.g. drain electrode) is disposed between a respective first power electrode 22 and a second power electrode 24, and a first gate arrangement 28 is disposed between a first power electrode 22 and a third power electrode 26, while a second gate arrangement 30 is disposed between a second power electrode 24 and a third power electrode 26.

Figure 3:
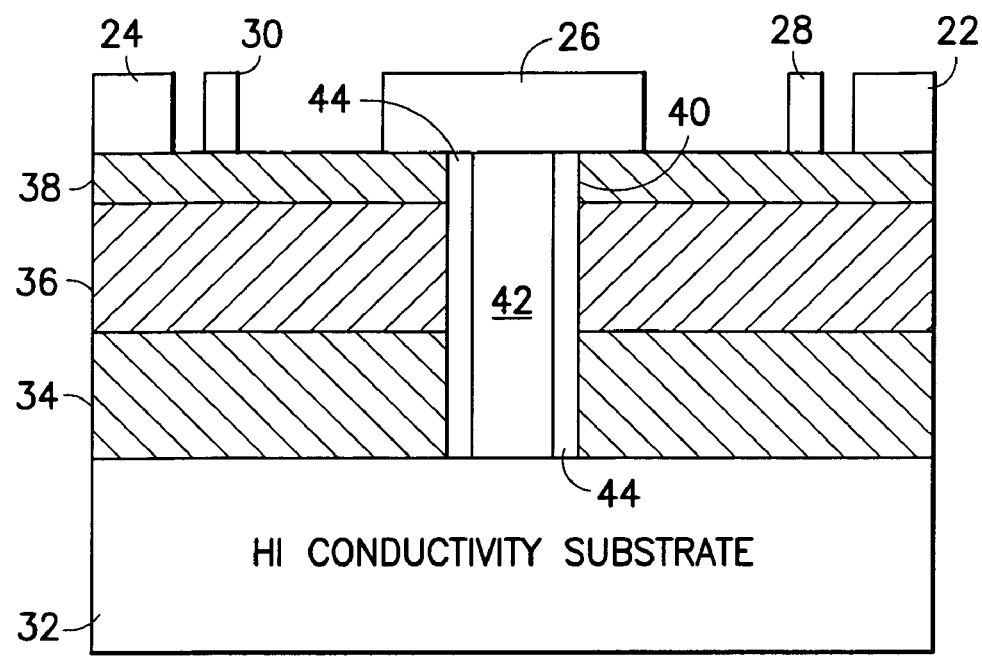
FIG. 3 shows a cross-sectional view of a first embodiment of the present invention along line 3-3 in FIG. 2 seen in the direction of the arrows.

Referring now to FIG. 3, a III-nitride device according to the present invention includes an electrically conductive substrate 32, which may be highly conductive silicon, or SiC, a III-nitride transition layer 34 over substrate 32, which may be graded or uniform AN, a III-nitride buffer layer 36 over transition layer 34, which may be composed of GaN, and III-nitride active heterojunction 38. III-nitride active heterojunction 38 may include a III-nitride channel layer, e.g. GaN, disposed preferably on III-nitride buffer layer 36, and a III-nitride confinement layer, e.g. AlGaN, disposed on and making a heterojunction with the channel layer. The thickness and composition of the channel layer and the confinement layer are selected to generate a two-dimensional electron gas (2-DEG) in the channel layer close to the heterojunction of the two layers. As is well known the 2-DEG is an electron rich region that carries the current. To transmit the current, first power electrode 22 and second power electrode 24 are coupled to heterojunction 38 preferably through a direct ohmic contact to the confinement layer of heterojunction 38, which preferably is under each power electrode.

According to one aspect of the present invention, a trench 40 extends through the stack of heterojunction 38, III-nitride buffer layer 36, and transition layer 34 and reaches substrate 32. A metallic plug 42 fills trench 40 and is electrically connected to third power electrode 26, whereby a direct electrical connection is made between third power electrode 26 and substrate 32. Note that optionally a dielectric body 44 may line the sidewalls of trench 40 and insulate plug 42 from the trench sidewalls.

In the first embodiment of the present invention (FIG. 3), first gate arrangement 28 and second gate arrangement 30 are bodies that make Schottky contact with III-nitride heterojunction 38.

Figure 4:
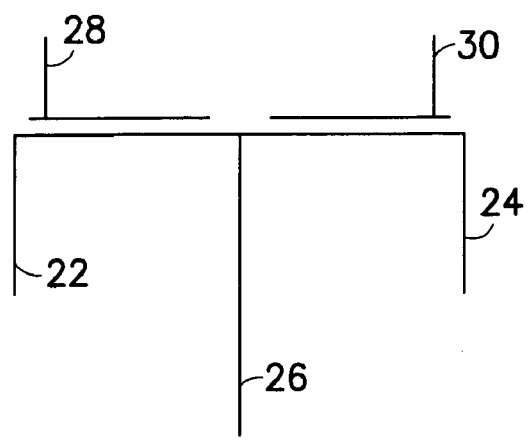
FIG. 4 shows a circuit diagram for a device according to the present invention.

FIG. 4 illustrates a circuit diagram of a device according to the present invention.

Figure 5:
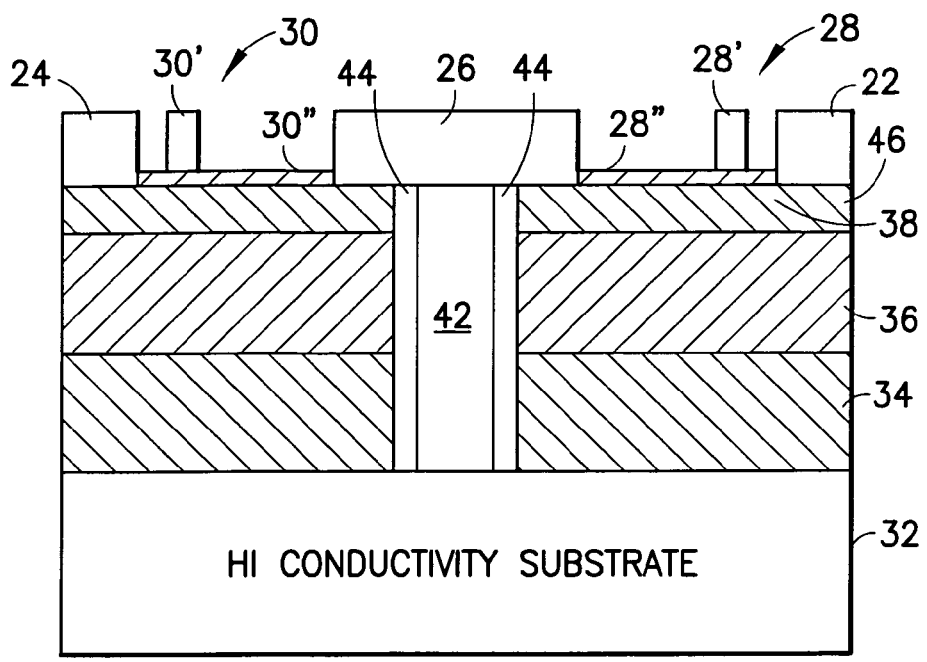
FIG. 5 shows a cross-sectional view of a second embodiment of the present invention along line 3-3 in FIG. 2 seen in the direction of the arrows.

Referring to FIG. 5, in which like numerals identify like features, in a device according to the second embodiment each gate arrangement 28, 30 includes a gate electrode 28', 30' disposed on a respective gate dielectric body 28", 30", which is itself disposed on heterojunction 38. Gate dielectric body 28", 30" may be any suitable insulation such as $SiO_2$, or $Si_3N_4$.

Figure 6:
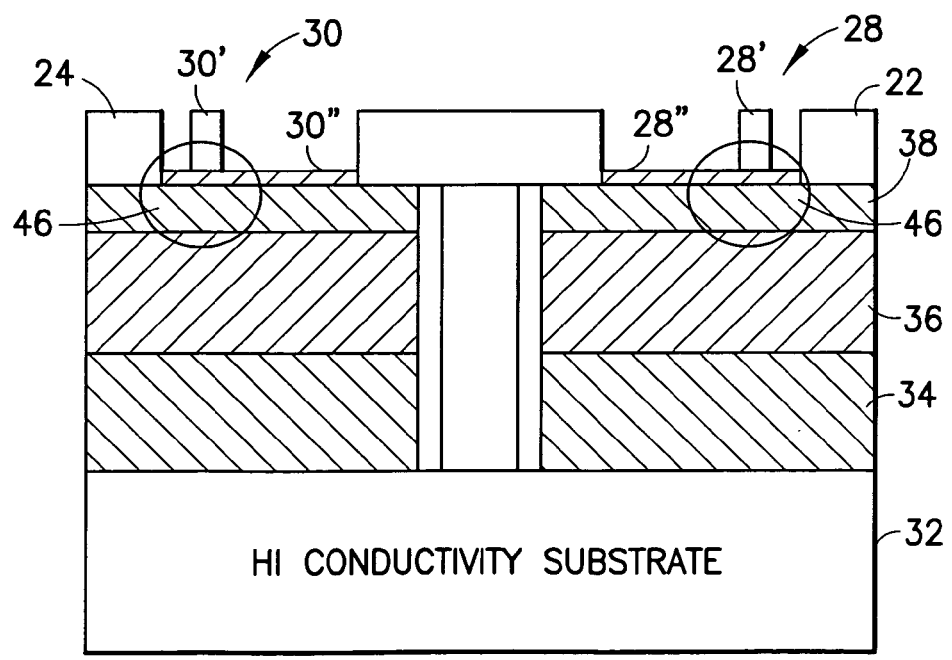
FIG. 6 shows a cross-sectional view of a third embodiment of the present invention along line 3-3 in FIG. 2 seen in the direction of the arrows.

Referring to FIG. 6, in which like numerals identify like features, in a device according to the third embodiment, regions 46 under each gate arrangement 28, 30 are implanted with appropriate doping species (e.g. P-type) to interrupt the 2DEG in heterojunction 38, whereby the device may be rendered normally off. That is, an enhancement mode device can be obtained.

Figure 7:
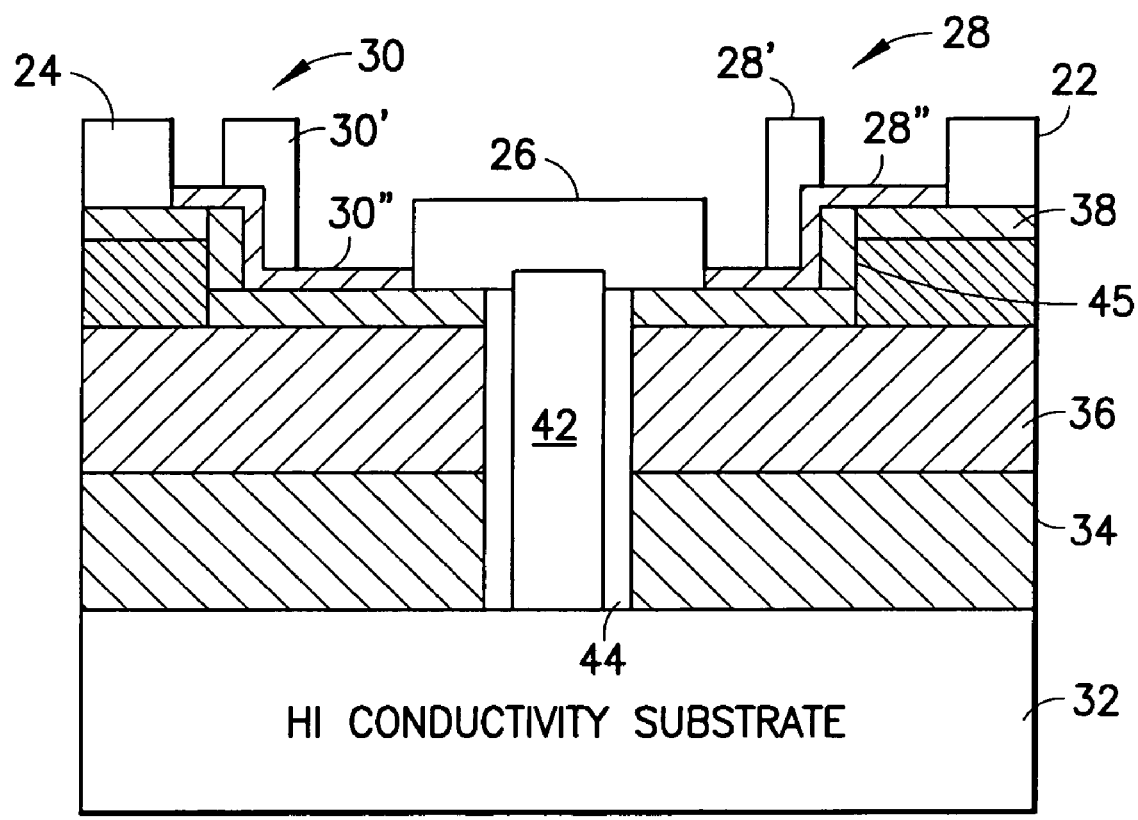
FIG. 7 shows a cross-sectional view of a fourth embodiment of the present invention along line 3-3 in FIG. 2 seen in the direction of the arrows.

Referring next to FIG. 7, in which like numerals identify like features, in a device according to the third embodiment, each gate arrangement 28, 30 is received partially inside a recess 45 in III-nitride buffer 36. Note that heterojunction 38 is also disposed at least partially inside recess 45, and third power electrode 26 is disposed over heterojunction 38 that resides over the bottom of recess 45. A portion of each gate arrangement 28, 30 is disposed on heterojunction 38 that is laterally outside of recess 45. A recess 45 in the third embodiment interrupts the 2-DEG in heterojunction 38, thereby rendering the 2-DEG normally off. As a result an enhancement mode device can be obtained.

The concept disclosed herein is applicable to devices which will operate in the enhancement mode, such as planar devices with oxidation of the AlGaN layer under the gate; recess etching under the gate; and ion implantation/doping under the gate. The concept disclosed herein also applies to non-planar gate devices with regrowth of the barrier layer, to devices employing the use of N-Polar material, as is described in my copending application IR-3052 Prov entitled NITROGEN POLAR III-N HJFET filed Dec. 30, 2005 the subject matter of which is incorporated herein by reference. It is further possible to employ the concept disclosed herein to devices containing a mix of one or more enhancement mode devices and one or more depletion mode devices.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A III-nitride semiconductor device, comprising:
an active III-nitride heterojunction that includes a two dimensional electron gas, said heterojunction comprising a III-nitride channel layer and a III-nitride barrier confinement layer disposed over said III-nitride channel layer;
a conductive substrate supporting said heterojunction;
a first power contact;
a plurality of first power runners connected to said first power contact;
a second power contact;
a plurality of second power runners connected to said second power contact;
a first power electrode coupled to said heterojunction and connected to and extending from one of said first power runners;
a second power electrode coupled to said heterojunction and connected to and extending from one of said second power runners;
a third power electrode disposed between said first and said second power electrodes;
a trench through said heterojunction under said third power electrode, said trench extending through said III-nitride confinement layer and said III-nitride channel layer;
an electrically conductive body inside said trench and electrically connected to said substrate and said third power electrode;
a first gate arrangement between said first power electrode and said third power electrode; and
a second gate arrangement between said second power electrode and said third power electrode;
wherein said first power runners and said second power runners are alternately arranged in an interdigitated pattern.

2. The device of claim 1, wherein each said gate arrangement includes a gate electrode and a gate dielectric disposed between said gate electrode and said heterojunction.

3. The device of claim 2, wherein said gate dielectric is comprised either silicon dioxide or silicon nitride.

4. The device of claim 1, further comprising an implanted region under each gate arrangement to interrupt said two dimensional electron gas.

5. The device of claim 1, further comprising a III-nitride transition layer over said substrate, and a III-nitride buffer layer between said transition layer and said heterojunction.

6. The device of claim 5, wherein said substrate is comprised of silicon, said transition layer is comprised of AlN, and said buffer layer is comprised of GaN.

7. The device of claim 1, wherein said substrate is comprised of silicon.

8. The device of claim 1, wherein said substrate is comprised of SiC.

9. The device of claim 5, wherein said trench extends through said buffer layer and said transition layer.

10. The device of claim 9, wherein said trench is lined with a dielectric.

11. The device of claim 1, wherein said electrically conductive body is comprised of a metallic body.

12. The device of claim 1, wherein said confinement layer is coupled to said first and said second power electrodes.

13. The device of claim 1, wherein said channel layer is comprised of GaN, and said confinement layer is comprised of AlGaN.

14. An enhancement mode III-nitride semiconductor device comprising:
a III-nitride heterojunction that includes a two dimensional electron gas (2DEG), said III-nitride heterojunction comprising a III-nitride channel layer and a III-nitride confinement layer disposed over said III-nitride channel layer;

a conductive substrate supporting said heterojunction;
a power electrode;
a trench through said III-nitride heterojunction under said power electrode, said trench extending through said III-nitride confinement layer and said III-nitride channel layer;
an electrically conductive body inside said trench and electrically connected to said conductive substrate and said power electrode;
at least two gates disposed on each side of said power electrode;
said 2DEG including an interrupted region under each of said at least two gates.

15. The enhancement mode III-nitride semiconductor device of claim 14, wherein each of said at least two gates includes a gate electrode and a gate dielectric.

16. The enhancement mode III-nitride semiconductor device of claim 15, wherein said gate dielectric comprises one of silicon dioxide and silicon nitride.

17. The enhancement mode III-nitride semiconductor device of claim 14, wherein said III-nitride channel layer comprises GaN, and said III-nitride confinement layer comprises AlGaN.

18. The enhancement mode III-nitride semiconductor device of claim 14, wherein said interrupted region of said 2DEG comprises an implanted region under said at least two gates.

19. The enhancement mode III-nitride semiconductor device of claim 14, further comprising a recessed portion in said III-nitride confinement layer, said heterojunction conformally disposed on said recessed portion.

20. The enhancement mode III-nitride semiconductor device of claim 19, wherein said recessed portion comprises said interrupted region of said 2DEG.

* * * * *

UNITED STATES PATENT AND TRADEMARK OFFICE
CERTIFICATE OF CORRECTION

| | | |
|---|---|---|
| PATENT NO. | : 7,821,034 B2 | Page 1 of 1 |
| APPLICATION NO. | : 11/650835 | |
| DATED | : October 26, 2010 | |
| INVENTOR(S) | : Beach et al. | |

It is certified that error appears in the above-identified patent and that said Letters Patent is hereby corrected as shown below:

In the claims, column 4, line 1, "barrier" should be deleted.

Signed and Sealed this
Sixth Day of December, 2011

David J. Kappos
*Director of the United States Patent and Trademark Office*